United States Patent
Ngai et al.

(10) Patent No.: US 7,216,277 B1
(45) Date of Patent: May 8, 2007

(54) SELF-REPAIRING REDUNDANCY FOR MEMORY BLOCKS IN PROGRAMMABLE LOGIC DEVICES

(75) Inventors: Tony K. Ngai, Saratoga, CA (US); Jennifer Wong, Fremont, CA (US); Wayson J. Lowe, Belmont, CA (US)

(73) Assignee: Xilinx, Inc., San Jose, CA (US)

( * ) Notice: Subject to any disclaimer, the term of this patent is extended or adjusted under 35 U.S.C. 154(b) by 458 days.

(21) Appl. No.: 10/717,040

(22) Filed: Nov. 18, 2003

(51) Int. Cl.
*G01R 31/28* (2006.01)
*G11C 29/00* (2006.01)

(52) U.S. Cl. .................................. 714/733; 714/711
(58) Field of Classification Search ............ None
See application file for complete search history.

(56) References Cited

U.S. PATENT DOCUMENTS

| | | | |
|---|---|---|---|
| 3,995,261 A | 11/1976 | Goldberg | |
| 4,020,469 A | 4/1977 | Manning | |
| 4,700,187 A | 10/1987 | Furtek | |
| 4,899,067 A | 2/1990 | So et al. | |
| 5,153,880 A | 10/1992 | Owen | |
| 5,255,227 A | 10/1993 | Haeffele | |
| 5,459,342 A | 10/1995 | Nogami et al. | |
| 5,485,102 A * | 1/1996 | Cliff et al. | 326/10 |
| 5,498,975 A * | 3/1996 | Cliff et al. | 326/10 |
| 5,513,144 A | 4/1996 | O'Toole | |
| 5,592,102 A | 1/1997 | Lane et al. | |
| 5,742,556 A | 4/1998 | Tavrow et al. | |
| 5,764,577 A | 6/1998 | Johnston et al. | |
| 5,777,887 A | 7/1998 | Marple et al. | |
| 5,889,413 A | 3/1999 | Bauer | |
| 5,914,616 A | 6/1999 | Young et al. | |
| 6,020,757 A * | 2/2000 | Jenkins, IV | 326/39 |
| 6,055,205 A * | 4/2000 | Rao et al. | 365/230.06 |
| 6,166,559 A | 12/2000 | McClintock et al. | |
| 6,167,558 A | 12/2000 | Trimberger | |

(Continued)

OTHER PUBLICATIONS

U.S. Appl. No. 09/924,365, filed Aug. 7, 2001, Ling et al.
John Emmert et al.; "Dynamic Fault Tolerance in FPGAs via Partial Reconfiguration"; Annual IEEE Symposium on Field-Programmable Custom Computing Machines; Apr. 17, 2000; pp. 165-174.

(Continued)

*Primary Examiner*—Guy Lamarre
*Assistant Examiner*—John J. Tabone, Jr.
(74) *Attorney, Agent, or Firm*—LeRoy D. Maunu; Lois D. Cartier

(57) ABSTRACT

Programmable logic devices (PLDs) including self-repairing RAM circuits, and methods of automatically replacing defective columns in RAM arrays. A RAM circuit including redundant columns is tested during the PLD configuration sequence using a built in self test (BIST) procedure. If a defective column is detected, an error flag is stored in an associated volatile memory circuit. After the BIST procedure is complete, the PLD configuration process continues. The presence of the error flag causes the configuration data to bypass the defective column and to be passed directly into a replacement column. The configuration process continues until the remainder of the circuit is configured, including the redundant column. In other embodiments, the BIST procedure is initiated independently from the PLD configuration process. When a defective column is detected, user operation resumes with data being shunted from the defective column to a redundant column in a fashion transparent to the user.

42 Claims, 6 Drawing Sheets

U.S. PATENT DOCUMENTS

| | | | |
|---|---|---|---|
| 6,304,101 B1* | 10/2001 | Nishihara | 326/41 |
| 6,344,755 B1 | 2/2002 | Reddy et al. | |
| 6,356,514 B1 | 3/2002 | Wells et al. | |
| 6,560,740 B1 | 5/2003 | Zuraski, Jr. et al. | |
| 6,605,960 B2* | 8/2003 | Veenstra et al. | 326/38 |
| 2002/0120826 A1* | 8/2002 | Venkatraman et al. | 71/207 |
| 2005/0022065 A1* | 1/2005 | Dixon et al. | 714/42 |

OTHER PUBLICATIONS

John M. Emmert et al.; "Incremental Routing in FPGAs"; ASIC Conference 1998. Proceedings, Eleventh Annual IEEE International; Rochester, NY; Sep. 13-16, 1998; pp. 217-221.

Xilinx, Inc.; "Virtex-II Pro Platform FPGA Handbook"; published Oct. 14, 2002; available from Xilinx, Inc., 2100 Logic Drive, San Jose, California 95124; pp. 19-71.

* cited by examiner

SELF-REPAIRING REDUNDANCY FOR MEMORY BLOCKS IN PROGRAMMABLE LOGIC DEVICES

FIELD OF THE INVENTION

The invention relates to Programmable Logic Devices (PLDs). More particularly, the invention relates to a memory block in a PLD that detects and automatically repairs defects during the configuration process for the PLD.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure.

The logic blocks and interconnect structure are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Some FPGAs also include additional logic blocks with special purposes in the configurable array. For example, the Xilinx Virtex-II Pro™ FPGA includes blocks of Random Access Memory (RAM), blocks implementing multiplier functions, and embedded processor blocks. (The Xilinx Virtex-II Pro FPGA is described in detail in pages 19–71 of the "Virtex-II Pro Platform FPGA Handbook", published Oct. 14, 2002 and available from Xilinx, Inc., 2100 Logic Drive, San Jose, Calif. 95124, which pages are incorporated herein by reference.)

FPGAs are increasing in size with each product generation. At the same time, the minimum feature size (e.g., gate length, metal width, and so forth) is decreasing. Each of these trends increases the susceptibility of the FPGA to manufacturing defects. Therefore, it is desirable to provide structures and methods that reduce the susceptibility of FPGA circuits to manufacturing defects. It is particularly desirable to reduce the susceptibility of repetitive circuits to manufacturing defects. For example, if a logic block that is repeated many times is rendered less susceptible, the gain in product yield is larger than the gain resulting from a similar improvement to a circuit that is included only once. Further, it is particularly desirable to reduce the susceptibility of circuits that can be unusually sensitive to manufacturing defects, such as memory cells in a RAM array that typically comprise minimum-sized transistors designed to consume the smallest possible area.

A known method of reducing susceptibility to manufacturing defects in a PLD RAM array is to include a redundant column of memory cells in the RAM array. For example, such a method is described by Cliff et al. in U.S. Pat. No. 5,498,975 entitled "Implementation of Redundancy on a Programmable Logic Device", which is hereby incorporated herein by reference. When this type of PLD RAM array is used, each column of memory cells is tested during the PLD testing process. If a defect is detected in any column in the array, fuses are blown to effectively bypass the column of RAM cells. The device then functions with a column offset in the array, but in a manner transparent to the PLD user. In some cases, non-volatile memory cells (e.g., EEPROM or flash cells) are used to control the column selection instead of fuses.

However, this type of device has its disadvantages. For example, the fuses or non-volatile memory cells must be manufactured as part of the PLD, which adds to the manufacturing complexity and cost. An additional disadvantage of fuse-based methods is that the testing and repair are typically performed "at the factory" (prior to shipping to the user), and any column offset is made permanent at that time. If a defect develops (i.e., one or more of the RAM columns ceases to operate correctly) after the column offset procedure is performed and the device is already in place within the target system, it is then too late to repair the defect. Even if non-volatile memory cells are used, reprogramming of the non-volatile memory cells typically involves the use of a separate piece of programming hardware that might be unavailable within the user's system.

Therefore, it is desirable to provide methods and structures for self-test and self-repair of PLD RAM arrays.

SUMMARY OF THE INVENTION

The invention provides a programmable logic device (PLD) including a self-repairing RAM circuit, and a method of configuring the PLD. A PLD RAM circuit including one or more redundant columns is tested during the PLD configuration sequence using a built in self test (BIST) procedure. If a defective column is detected (e.g., the read data does not match the write data previously written to the column), an error flag associated with the column is set, using a volatile memory circuit to store the error flag. After the BIST procedure is complete, the PLD configuration process continues by loading the configuration data into the PLD, including the RAM circuit. The presence of the error flag causes the configuration data to bypass the defective column and to be passed directly into a replacement column (e.g., the adjacent column). The configuration of the RAM circuit continues until the remainder of the circuit is configured, including the redundant column. Thus, the detection and replacement of the defective column are transparent to the PLD user.

In some embodiments, multiple redundant columns are included in the RAM circuit. The multiple redundant columns can be adjacent to each other, spaced equally within the RAM circuit, grouped such that the redundant columns are adjacent and the groups are equally spaced, or in some other configuration. In some embodiments, the PLD includes two or more similar RAM circuits (e.g., configurable RAM blocks in an FPGA), and a BIST control circuit provides control signals simultaneously to the two or more similar RAM circuits. Thus, the similar RAM circuits are tested in parallel by a single BIST control circuit.

According to another aspect of the invention, the BIST procedure is initiated independently of the configuration sequence for the PLD. For example, in a PLD system operating continuously "in the field", the BIST procedure can be initiated at any time on a previously-configured PLD. If a defective column is detected in the PLD (e.g., the read data does not match the write data previously written to the column), an error flag associated with the column is set, using a volatile memory circuit to store the error flag. When user operation of the PLD resumes, write data directed to the defective column is passed into a replacement column, and read data from the replacement column is provided in place of read data from the defective column.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
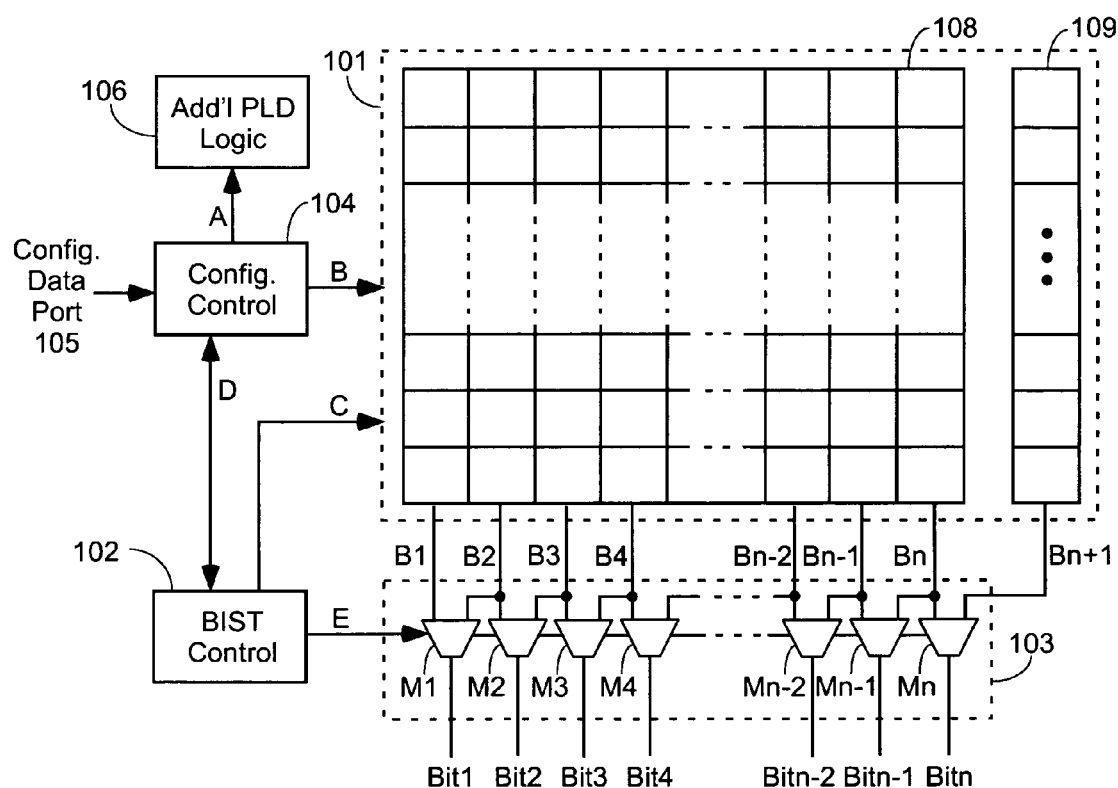
FIG. 1 is a block diagram of a first PLD including a RAM circuit that is automatically tested and repaired during the PLD configuration process, according to an embodiment of the present invention.

FIG. 1 is a block diagram of a first PLD including a RAM circuit that is automatically tested and repaired during the PLD configuration process, according to an embodiment of the present invention. The PLD of FIG. 1 includes a RAM circuit 101, a BIST control circuit 102, a routing circuit 103, a configuration control circuit 104, a configuration data port 105, and, optionally, additional PLD logic 106. RAM circuit 101 includes an array 108 comprising n columns of RAM cells provided on bit lines B1–Bn, where n is a positive integer. However, RAM circuit 101 also includes an additional column 109 of RAM cells referred to herein as the redundant column. The redundant column is provided as a replacement for any column in array 108 that might prove defective.

Configuration control circuit 104 is coupled to receive configuration data from configuration data port 105, and to supply the configuration data to RAM circuit 101 (as part of signals B) and to other PLD logic 106 (as part of signals A). Another function of configuration control circuit 104 is to provide control signals via signals A, B, and D to the additional PLD logic 106, RAM circuit 101, and BIST control circuit 102, respectively. (Note that in the present specification, the same reference characters are used to refer to terminals, signal lines, and their corresponding signals.)

With the exception of logic associated with signals D, configuration control circuit 104 can be implemented, for example, using well known circuits such as those used in the aforementioned Virtex-II Pro FPGAs from Xilinx, Inc. Signals D can include, for example, a configuration clock signal and one or more enable signals provided by configuration control circuit 104 to BIST control circuit 102. The enable signal initiates the BIST procedure used by BIST control circuit 102 to test array 108, and the configuration clock signal is used to clock the BIST procedure. Signals D can also include, for example, status signals provided by BIST control circuit 102 to configuration control circuit 104. Such a status signal can be used, for example, to indicate the termination of the BIST procedure.

Figure 5:
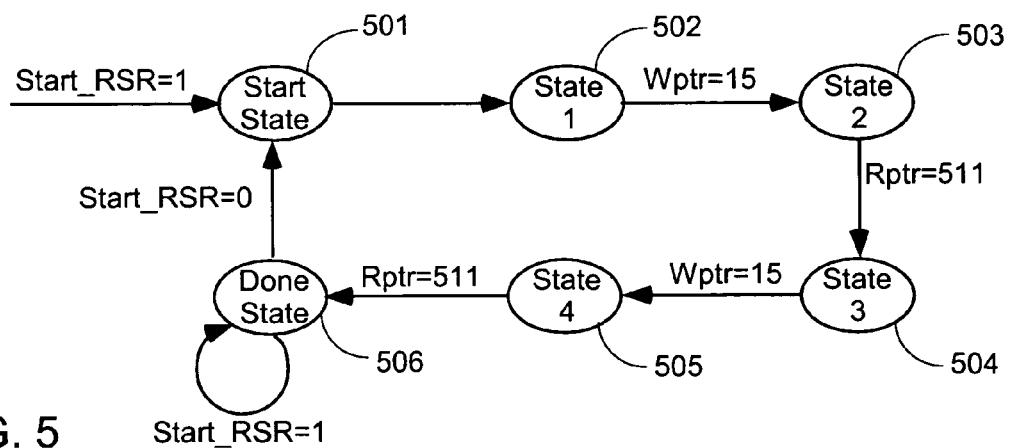
FIG. 5 is an exemplary state diagram for the BIST control circuit included in the embodiment of FIG. 1.

BIST control circuit 102 is a state machine that generates the test data patterns, read/write addresses, and control signals needed to perform one or a series of tests on array 108. (An exemplary state diagram for the BIST state machine is shown in FIG. 5 and is described below in conjunction with that figure.) The read and write addresses are generated using binary counters, which are well known. Data loaded into array 108 preferably follows the well known checkerboard and reverse checkerboard patterns. For example, the pattern 0101_1010_0101_1010 . . . can be used, followed by the pattern 1010_0101_1010_0101 . . . . These patterns are easily generated using known logic circuits. Each of these patterns is first written to and then read back from array 108 to detect stuck-at and bridging faults. BIST control circuits utilizing checkerboard and reverse checkerboard patterns are well known in the relevant arts. In other embodiments, patterns other than the checkerboard and reverse checkerboard patterns are used to provide the desired test coverage.

Routing circuit 103 illustrates how the redundant column 109 of RAM cells can be used in the event of a defective column in array 108. Multiplexers M1–Mn select either the bit (Bi) from the associated column, or the bit (Bi+1) from the adjacent column. (Note that multiplexers M1–Mn function as multiplexers during a read from the RAM circuit, and as demultiplexers during a write to the RAM circuit.) If a defective column is found, the multiplexer Mi associated with the defective column is configured to select the bit (Bi+1) from the adjacent column. All multiplexers to the right of the defective column are also configured to select the bits from the adjacent column.

Figure 2:
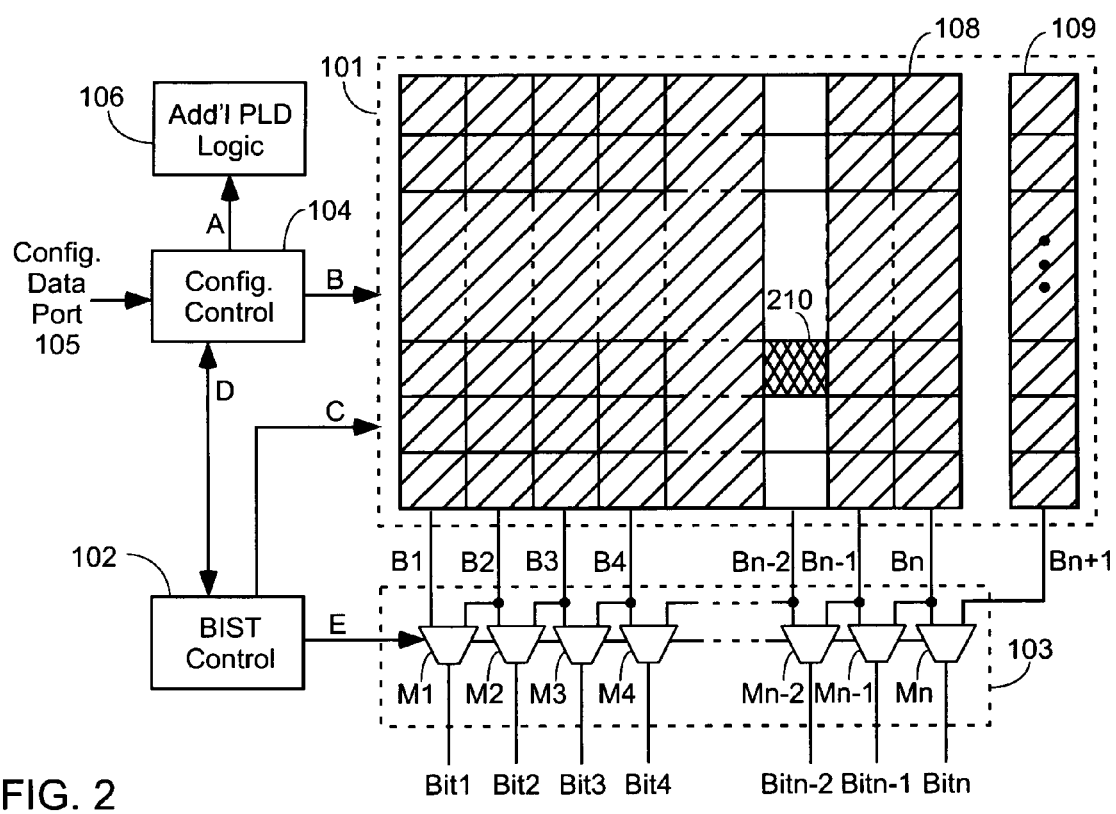
FIG. 2 is another block diagram of the PLD of FIG. 1 that illustrates the usage of a defective RAM circuit, according to an embodiment of the invention.

FIG. 2 illustrates the portions of RAM circuit 101 that will be used when array 108 includes an exemplary defective RAM cell. In the pictured embodiment, RAM cell 210 is defective. (The defective circuitry is denoted by a cross-hatched pattern.) Therefore, the column of RAM cells that includes RAM cell 210 is bypassed both during the configuration of the RAM array with the configuration data stream, and during later user operation of the configured device. Instead, routing circuit 103 selects the column to the right of the column including RAM cell 210, and this shifting applies for all of the remaining columns. Thus, the redundant column 109 is used to interface to the final bit Bitn. The RAM cells that are actually configured by the subsequent configuration process, and then are available for use by a user design, are denoted in FIG. 2 by a fill pattern of diagonal lines.

Figure 3:
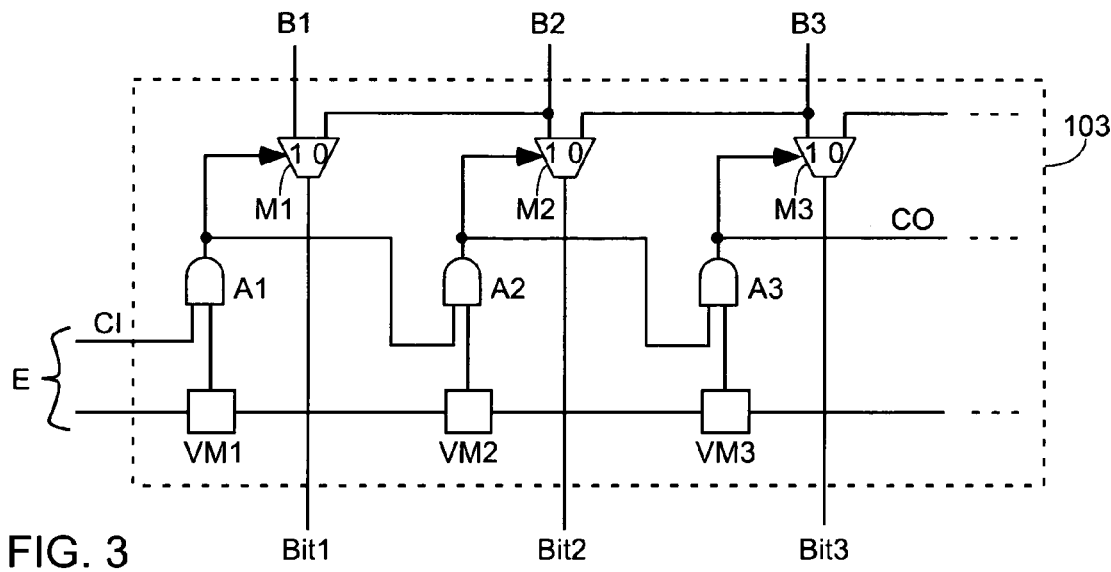
FIG. 3 is a more detailed view of the routing circuit included in the PLD of FIG. 1.

FIG. 3 shows additional details of routing circuit 103, and illustrates how the column bypass is achieved. Multiplexers M1–Mn are each controlled by an associated AND gate A1–An, which is driven by a carry-in signal from the left and a signal from an associated volatile memory circuit VM1–VMn. When one of volatile memory circuits VM1–VMn stores a low value, the associated AND gate A1–An drives a low value. This low value controls the associated multiplexer Mi to select the bit signal Bi+1 from the adjacent column rather signal Bi from the associated column of RAM cells. Further, the low value is also passed to the adjacent AND gate to the right, which again forces the associated multiplexer Mi+1 to select the bit signal Bi+2 from the adjacent column. This process continues along the chain from AND gate to AND gate, ensuring that all subsequent column bits are shifted by one.

As logically illustrated in FIG. 3, the values stored in volatile memory circuits VM1–VMn are initially set (high). If the BIST procedure detects a defective column, the value stored in the associated volatile memory circuit is reset (low), and that column is bypassed using the process described above. In other embodiments, the values stored in the volatile memory circuits are initially reset, and are set if a defective column is detected. In either case, each AND gate Ai is initially configured to select the associated bit signal Bi, then is reconfigured to select the adjacent bit signal Bi+1 if an error is detected. In either case, the change in the value stored in the volatile memory circuit is referred to herein as "setting an error flag".

Figure 4:
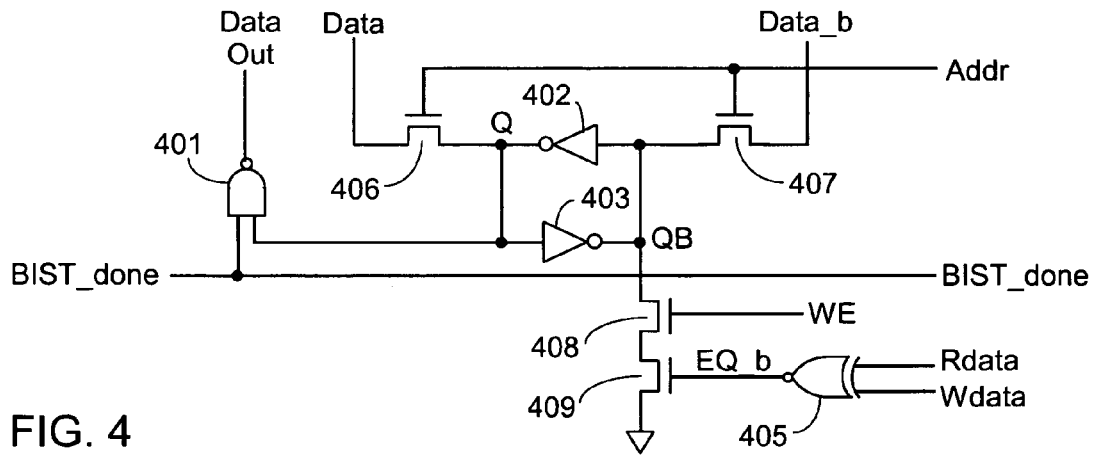
FIG. 4 illustrates an exemplary volatile memory circuit that can be used, for example, in the routing circuit of FIG. 3.

FIG. 4 illustrates one embodiment of volatile memory circuits VM1, VM2, VM3 . . . that can be used, for example, in the routing circuit of FIG. 3. Cross-coupled inverters 402, 403 and transistors 406, 407 together form a volatile RAM cell. The value stored in the volatile RAM cell is denoted in FIG. 4 as node Q. Node Q is initially low, and signal Data Out (the data output terminal of the volatile memory circuit) is high, selecting the associated column in the RAM circuit. Provided that signal BIST_done is high, a high value on node Q causes NAND gate 401 to provide a low value to the Data Out terminal. As previously described in connection with FIG. 3, a low value on the Data Out terminal causes the associated column of the RAM circuit to be bypassed. Note that if signal BIST_done is low, signal Data Out is always high, and the associated column is not bypassed. The BIST_done signal is provided by the BIST control circuit (see FIG. 1), and is used to prevent the bypassing of any columns until after the BIST procedure is complete.

Exclusive NOR (XNOR) gate 405 performs the comparison between the data written to the array (Wdata) with the data read back from the same location (Rdata). If the data differ, signal EQ_b is high, enabling transistor 409. When transistor 408 is enabled by write enable signal WE, node QB (which is initially high) is pulled to a low value while node Q goes high. Thus, as described above, the associated column is bypassed once signal BIST_done goes high.

An exemplary BIST procedure includes the following series of steps:
1) generating write and read addresses using binary counters;
2) enabling the write and read controls;
3) writing the test data to the array;
4) reading back from the array the data from the same address;
5) comparing the read data with the previous write data; and
6) loading the result to a volatile memory cell associated with the write and read address.

Note that step 6 is the step in which the error flag is set for a defective array address. Note further that these steps are not necessarily performed sequentially. For example, in one embodiment the write address is advanced by 16 addresses compared to the read address, then after that point the writes, reads, and compares occur concurrently. After all the writes are complete, 16 more reads and compares occur. After all the comparisons are complete, the results are loaded into an associated series of volatile memory cells.

To perform these steps, an exemplary BIST control circuit includes three major components: read and write pointer circuits; a data pattern generator; and a control block (e.g., a state machine). Read and write pointer circuits are well known, as are data pattern generators such as those providing checkerboard and reverse checkerboard patterns. Any appropriate implementation of these circuits can be used to implement the structures and methods of the present invention. Therefore, these circuits are not described in detail herein.

The control circuit is best understood in conjunction with the state diagram shown in FIG. 5. The state machine of FIG. 5 can be used, for example, with the embodiment illustrated in FIG. 1. Briefly, the states shown in FIG. 5 are as follows:
Start: Start State
State 1: Write first M data values using checkerboard pattern, where M is an integer
State 2: Begin reads and compares; continue writes. Continue until all reads and compares are complete. Set error flags in volatile memory cells when errors are found.
State 3: Reset read and write pointers. Write first M data values using reverse checkerboard pattern
State 4: Begin reads and compares; continue writes. Continue until all reads and compares are complete. Set error flags in volatile memory cells when errors are found.
Done: Enable column bypassing The Start State 501 is entered when a redundancy self repair (RSR) signal Start_RSR goes high. The Start_RSR signal can be driven high, for example, by the configuration control circuit when the circuit is powered up. Additionally or alternatively, the RSR signal can be driven high by an external signal, e.g., an enable signal provided by a user.

From the Start State 501, the BIST control circuit enters State 1 (502) wherein the write counter is enabled for a limited period (e.g., 16 clock cycles) and test data in a checkerboard pattern is written to a sequence of addresses in the array. This step ensures the completion of the write step prior to attempting read back of the data stored at any given address. When this predetermined point is reached (e.g., the write address equals 15, or Wptr=15), the BIST control circuit enters State 2 (503).

In State 2 (503), the read counter is enabled. The write counter is also still enabled, therefore, writes continue to sequential addresses. Simultaneously, test data is read from sequential addresses in the array and compared to the write data for the corresponding address. If a discrepancy is found, a flag is set by changing a value stored in a volatile memory circuit associated with the write and read address. Eventually, the read pointer reaches a predetermined maximum value, e.g., test data has been read from the highest supported address. In one embodiment, there are 512 addresses in the array, so State 2 continues until the read pointer reaches a value of 511. This condition is indicated in FIG. 5 as "Rptr=511". When this point is reached, the BIST control circuit enters State 3 (504).

In States 3 and 4 (504 and 505, respectively, in FIG. 5), the write and read pointers are reset, and the process described for States 1 and 2 is repeated using a reverse checkerboard pattern. The combination of checkerboard and reverse checkerboard patterns is commonly used to detect stuck-at-high, stuck-at-low, and bridging defects. In other embodiments, other test patterns are used. In some embodiments, only one test pattern is used. In some embodiments, more than two test patterns are used.

When the read pointer again indicates that all values have been read and compared (e.g., Rptr=511), the state machine moves from State 4 to the Done State (506). At this point in the BIST process all appropriate error flags should be set in the volatile memory cells (e.g., see FIGS. 3 and 4). Bypassing is then enabled, e.g., by applying a high value to signal BIST_done in FIG. 4. In some embodiments, the BIST control circuit supplies a status signal (e.g., BIST_done) to the configuration logic indicating that the BIST procedure is complete. In other embodiments, the configuration control circuit includes a counter timer that defers the loading of the configuration data until sufficient time has passed to complete the BIST procedure. (In the present example, with (16+512) clock cycles for each of two test patterns, a counter timer that counts to 1100 clock cycles can be used, for example.) In either case, after completion of the BIST procedure the configuration process continues, and configuration data is loaded into the RAM circuit, bypassing any defective column in the array.

Note that some arrays might include more than one defective column. This drawback can be alleviated by providing additional redundant columns, e.g., as in the embodiment illustrated in FIG. 6.

Figure 6:
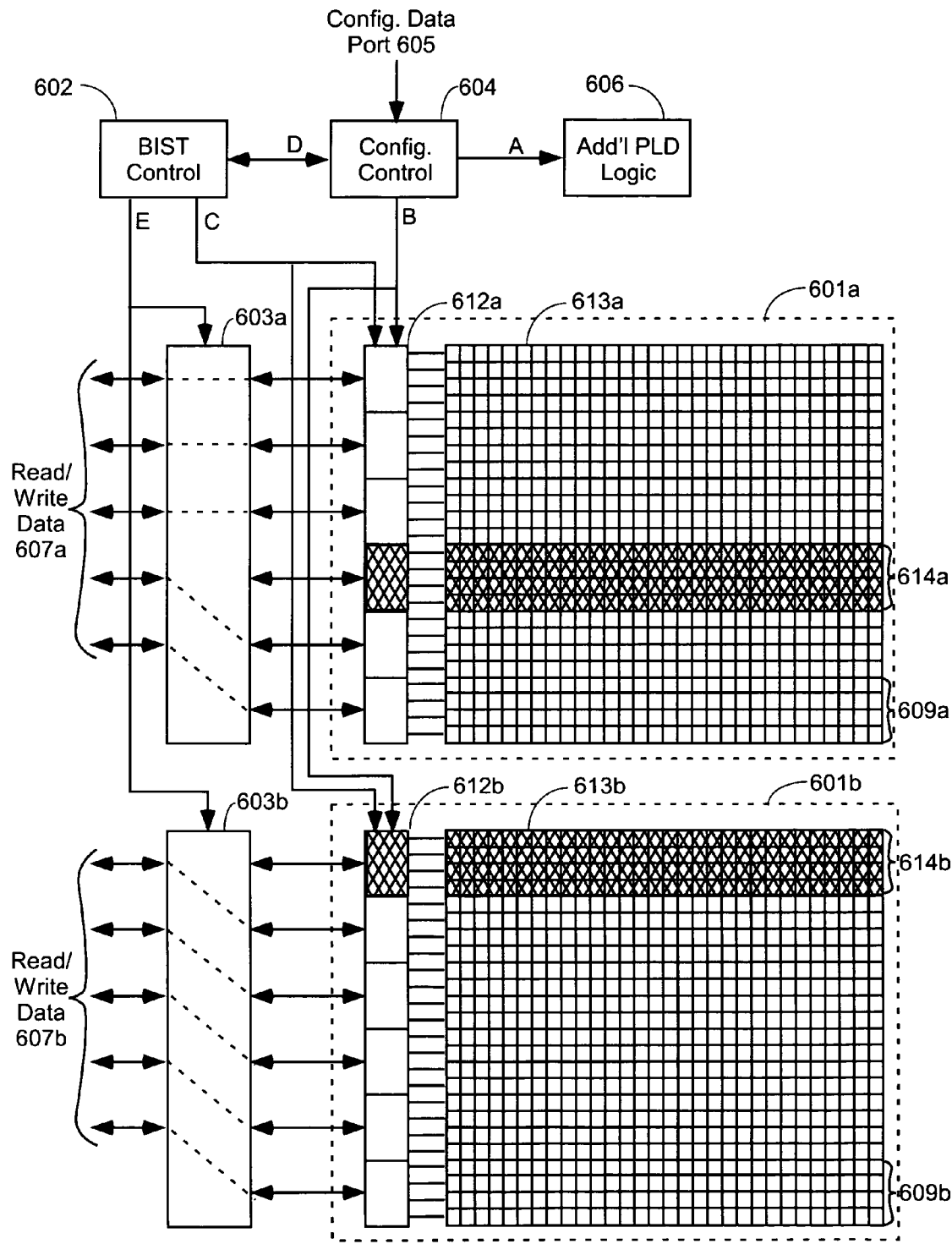
FIG. 6 is a block diagram of a second PLD including two RAM circuits that are automatically tested and repaired during the PLD configuration process according to an embodiment of the present invention.

FIG. 6 is a block diagram of a second PLD including two RAM circuits that are automatically tested and repaired during the PLD configuration process according to an embodiment of the present invention. In the pictured embodiment, each RAM circuit 601a, 601b includes four redundant columns 609a, 609b, respectively.

Note that in FIG. 6, the columns of RAM cells lie horizontally. The words "columns" and "rows" as applied to physical orientation can easily be interchanged by simply (for example) rotating a figure, PLD, or RAM circuit by 90 degrees. Therefore, the words "column" and "row" as used herein are not intended to imply any particular physical orientation. Further, the word "column" as used herein refers to a linear grouping of RAM cells oriented along either a bit line or a word line of the RAM array, while the word "row" refers to a linear grouping of RAM cells oriented orthogonally to a related column. In the exemplary circuits described herein, columns of RAM cells lie along bit lines of the RAM array. However, the invention can also be applied to circuits wherein the columns of RAM cells are oriented along word lines of the RAM array.

The PLD of FIG. 6 includes first and second RAM circuits 601a and 601b, a BIST control circuit 602, first and second routing circuits 603a and 603b coupled to first and second read/write data ports 607a and 607b, a configuration control circuit 604, a configuration data port 605, and, optionally, additional PLD logic 606. RAM circuits 601a, 601b each include an array 613a, 613b comprising n columns of RAM cells, where n is a positive integer, and four redundant columns 609a, 609b of RAM cells. The PLD of FIG. 6 is similar to that of FIG. 1, but differs from the PLD of FIG. 1 in certain ways that are now described.

RAM circuits 601a and 601b can be considered either as a single RAM circuit, or as two separate but similar RAM circuits. If considered as a single RAM circuit, the circuit includes two groups 609a and 609b of four redundant columns each. The groups of redundant columns are equally spaced within the RAM circuit. If considered as two separate RAM circuits, each RAM circuit 601a, 601b includes four redundant columns. In the pictured embodiment, the four redundant columns are grouped at the bottom edge of each RAM circuit (i.e., the edge towards the bottom of the figure). Each RAM circuit 601a, 601b is controlled in parallel by BIST control circuit 602. Thus, BIST control circuit 602 can simultaneously test both arrays, setting error flags within each RAM circuit as appropriate for any defective columns located.

In one embodiment, a PLD includes many RAM logic blocks. Each block RAM (BRAM) includes two similar RAM circuits, and each RAM circuit includes a first array of 128 rows and 72 columns, plus four redundant columns. In addition, a ring of dummy RAM cells is included around the periphery of each RAM circuit, to duplicate for the peripheral RAM cells the proximity effects experienced by the RAM cells located away from the periphery of the RAM circuit. In this embodiment, two sets of row decoders and drivers are located between the two similar RAM circuits, to balance the word line loading. The configuration control circuit for the BRAM and the BIST control circuit are also located between the two similar RAM circuits.

FIG. 6 also illustrates how a defective column group in each of the two arrays is bypassed. A column group can include, for example, a group of four adjacent columns that use shared sense amplifier circuitry. For example, in FIG. 6, blocks 612a and 612b represent rows of sense amplifiers, each sense amplifier being associated with four columns of RAM cells. Thus, a defect might be detected and isolated only to the extent that it is known to be somewhere in the circuitry associated with a particular sense amplifier.

For example, in FIG. 6, the circuitry in RAM circuit 601a that is identified as being defective includes four columns of RAM cells 614a and one associated sense amplifier circuit. As in FIG. 2, the defective circuitry is denoted by a cross-hatched pattern. The dotted lines through routing circuit 603a illustrate how the defective circuitry 614a is bypassed, e.g., using a circuit similar to that shown in FIG. 3.

Similarly, the circuitry in RAM circuit 601b that is identified as being defective includes four columns of RAM cells 614b and one associated sense amplifier circuit. Again, the defective circuitry is denoted by a cross-hatched pattern. The dotted lines through routing circuit 603b illustrate how the defective circuitry 614b is bypassed, e.g., using a circuit similar to that shown in FIG. 3.

Note that a defect in either the RAM cell column or the sense amplifier circuits can be localized and repaired, as illustrated in FIG. 6.

Figure 7:
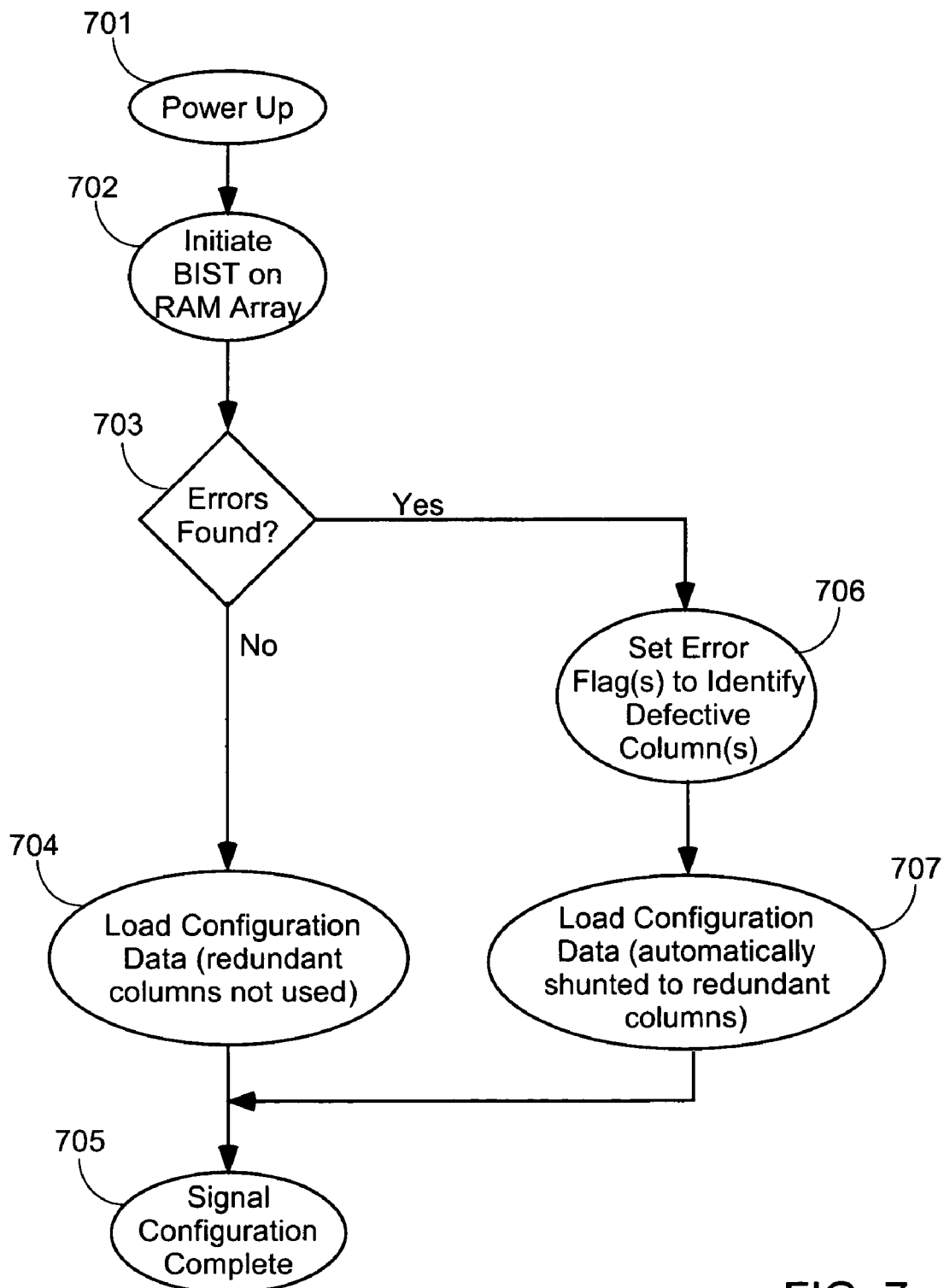
FIG. 7 illustrates the steps of an exemplary method of configuring a PLD, according to another aspect of the present invention.

FIG. 7 illustrates the steps of an exemplary method of configuring a PLD, according to another aspect of the present invention. The PLD includes a RAM circuit that includes both a first array of rows and columns of RAM cells and a redundant column of the RAM cells.

In step 701, configuration of the PLD is initiated, e.g., on power up of the device. In step 702, a built in self test (BIST) procedure is initiated on a RAM array included in the PLD. In some embodiments, this step is performed by a configuration control circuit, which provides an enable value on a BIST enable signal directed to a BIST control circuit.

During the BIST procedure, if errors are found (decision 703) one or more error flags are set (step 706) to indicate the defective column or columns. These error flags can be set, for example, by storing an error value in a volatile memory circuit associated with the defective column. In step 707, the configuration process for the PLD continues, with configuration data written to the RAM circuit being automatically shunted to bypass the defective columns and use the redundant columns.

If no defective columns are found during the BIST procedure, the configuration process for the PLD continues, with configuration data written to the RAM circuit being written to the standard columns (step 704). The redundant columns are not used.

After configuration of the PLD is complete (step 705), the PLD typically signals completion of the configuration process, e.g., by providing a high value on a DONE signal.

Note that the BIST procedure described above tests the RAM circuit and repairs defective columns in the RAM circuit without any intervention on the part of either the user or the PLD manufacturer.

Figure 8:
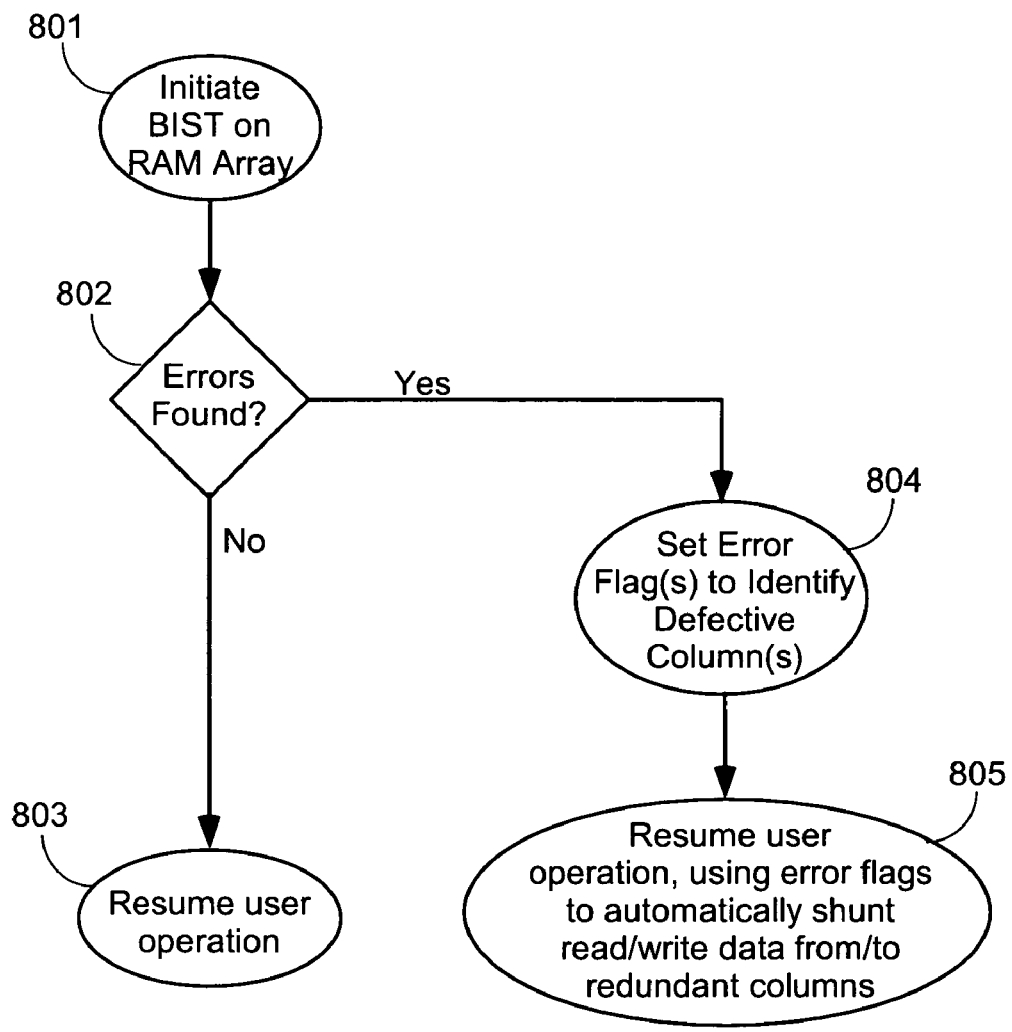
FIG. 8 illustrates the steps of a method of detecting and repairing defective columns in a RAM array, according to another embodiment of the invention.

FIG. 8 illustrates the steps of a method of detecting and repairing defective columns in a RAM array, according to another embodiment of the invention. In the embodiment of FIG. 8, the BIST procedure is initiated independently of the configuration sequence for the PLD, e.g., on a previously-configured PLD.

In step 801, a built in self test (BIST) procedure is initiated on a RAM array included in the PLD. In some embodiments, this step is performed by a configuration control circuit, which provides an enable value on a BIST enable signal directed to a BIST control circuit. In other embodiments, the procedure is initiated by a control signal provided by a user, and not as part of a configuration process for the PLD. Because the BIST procedure is initiated by a user control signal, the PLD need not be powered down or reconfigured to perform the self-test and repair.

During the BIST procedure, if errors are found (decision step 802) one or more error flags are set (step 804) to indicate the defective column or columns. These error flags can be set, for example, by storing an error value in a volatile memory circuit associated with the defective column. User operation is then resumed (step 805). The PLD logical circuits include logic that automatically shunts read date from, and write data to, redundant columns when an associated error flag is set.

If no defective columns are detected in the RAM array during the BIST procedure (decision step 802), normal user operation is resumed (step 803). The redundant columns are not used.

Those having skill in the relevant arts of the invention will now perceive various modifications and additions that can be made as a result of the disclosure herein. For example, the above text describes the circuits of the invention in the context of programmable logic devices (PLDs) such as field programmable gate arrays (FPGAs). However, the circuits of the invention can be implemented in any programmable logic device that includes volatile memory cells. As another example, memory array sizes used herein are purely exemplary, and the concepts of the invention can be applied to memory arrays of any size.

Further, transistors, configuration control circuits, routing circuits, BIST control circuits, BIST test patterns, AND gates, NAND gates, XNOR gates, state machines, sense amplifiers, inverters, memory cells, volatile memory cells, volatile memory circuits, RAM circuits, RAM cells, multiplexers, and other components other than those described herein can be used in implementing the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A method of configuring a programmable logic device (PLD) comprising a first random access memory (RAM) circuit that includes a first array of rows and columns of RAM cells and a first redundant column of the RAM cells, the method comprising:
   initiating a configuration sequence for the PLD;
   initiating a built in self test (BIST) procedure on the first array;
   setting, when an error associated with the first array is reported by the BIST procedure, a first error flag in a first volatile memory circuit associated with a first defective column of the RAM cells in the first array;
   wherein a respective error flag is associated with each column of RAM cells in the first array;
   loading first PLD configuration data into the first RAM circuit, wherein when the first error flag is set the first PLD configuration data bypasses the first defective column of the RAM cells and a first portion of the first PLD configuration data is loaded into the first redundant column of the RAM cells; and
   wherein the loading comprises generating for each column of RAM cells a respective selection signal as a function of the error flag associated with each column and a selection signal carried in from an adjacent column of RAM cells, and selecting for input to each column of RAM cells in response to the respective selection signal, one of a first set of bits of configuration data addressed to the column of RAM cells and a second set of bits of configuration data addressed to the adjacent column.

2. The method of claim 1, wherein the PLD comprises a second RAM circuit that includes a second array of rows and columns of the RAM cells and a second redundant column of the RAM cells, the method further comprising:
   initiating the BIST procedure on the second array concurrently with initiating the BIST procedure on the first array;
   setting, when an error associated with the second array is reported by the BIST procedure, a second error flag in a second volatile memory circuit associated with a second defective column of the RAM cells in the second array; and
   wherein a respective error flag is associated with each column of RAM cells in the second array;
   loading second PLD configuration data for the PLD into the second RAM circuit, wherein when the second error flag is set the second PLD configuration data bypasses the second defective column of the RAM cells and a second portion of the second PLD configuration data is loaded into the second redundant column of the RAM cells; and
   wherein the loading comprises generating for each column of RAM cells in the second array a respective selection signal as a function of the error flag associated with the column and a selection signal carried in from an adjacent column of RAM cells in the second array, and selecting for input to each column of RAM cells in response to the respective selection signal, one of a first set of bits of configuration data addressed to the column of RAM cells in the second array and a second set of bits of configuration data addressed to the adjacent column in the second array.

3. The method of claim 1, wherein initiating a configuration sequence for the PLD comprising powering up the PLD.

4. The method of claim 1, wherein the PLD is a field programmable gate array (FPGA).

5. The method of claim 1, wherein the first RAM circuit includes a plurality of redundant columns of the RAM cells, and setting the first error flag comprises setting the respective error flag associated with each defective column of RAM cells.

6. The method of claim 5, wherein the plurality of redundant columns of the RAM cells are adjacent to one another within the first RAM circuit.

7. The method of claim 5, wherein the plurality of redundant columns of the RAM cells are organized into groups that are equally spaced from one another within the first RAM circuit.

8. The method of claim 1, wherein the BIST procedure comprises writing and reading a checkerboard pattern and a reverse checkerboard pattern.

9. The method of claim 1, wherein the columns of RAM cells comprise linear groupings of the RAM cells oriented along bit lines of the array.

10. The method of claim 1, wherein the columns of RAM cells comprise linear groupings of the RAM cells oriented along word lines of the array.

11. A programmable logic device (PLD), comprising:
a first read/write data access port;
a first random access memory (RAM) circuit comprising a first array of rows and columns of RAM cells and further comprising a first redundant column of the RAM cells;
a first routing circuit coupled between the first data access port and the first RAM circuit;
wherein the first routing circuit comprises a plurality of volatile memory circuits, a plurality logic circuits, and a plurality of selector circuits, each volatile memory circuit, logic circuit, and selector circuit respectively associated with one of the columns of RAM cells;
wherein each logic circuit has a first input coupled to a respective one of the volatile memory circuits, a second input carried in from an output of a logic circuit associated with an adjacent column of RAM cells, and an output coupled to a selector input of the selector circuit;
wherein each selector circuit selects for input to the associated column of RAM cells, one of a first set of bits of configuration data addressed to the column of RAM cells and a second set of bits of configuration data addressed to the adjacent column;
a built in self test (BIST) control circuit coupled to the volatile memory circuits of the first routing circuit and further coupled to the first RAM circuit;
wherein the BIST control circuit is configured to test whether each column of RAM cells is defective, and responsive to a defective column of RAM cells, store a first value in the volatile memory circuit associated with the defective column of RAM cells;
a configuration data port; and
a configuration control circuit coupled to the BIST control circuit, the configuration data port, and the first RAM circuit.

12. The PLD of claim 11, further comprising:
a second read/write data access port;
a second RAM circuit comprising a second array of rows and columns of the RAM cells and further comprising a second redundant column of the RAM cells; and
a second routing circuit coupled between the second data access port and the second RAM circuit,
wherein the second routing circuit comprises a plurality of volatile memory circuits, a plurality logic circuits, and a plurality of selector circuits, each volatile memory circuit, logic circuit, and selector circuit respectively associated with one of the columns of RAM cells of the second RAM circuit;
wherein each logic circuit of the second routing circuit has a first input coupled to a respective one of the volatile memory circuits of the second routing circuit, a second input coupled to an output of a logic circuit associated with an adjacent column of RAM cells of the second RAM circuit, and an output coupled to a selector input of the selector circuit of the second routing circuit;
wherein each selector circuit of the second routing circuit selects for input to the associated column of RAM cells of the second RAM circuit, one of a first set of bits of configuration data addressed to the column of RAM cells of the second RAM circuit and a second set of bits of configuration data addressed to the adjacent column of the second RAM circuit;
wherein:
the BIST control circuit is further coupled to the volatile memory circuits of the second routing circuit and to the second RAM circuit;
wherein the BIST control circuit is configured to test whether each column of RAM cells of the second RAM circuit is defective, and responsive to a defective column of RAM cells in the second RAM circuit, store a first value in the volatile memory circuit associated with the defective column of RAM cells; and
the configuration control circuit is further coupled to the second RAM circuit.

13. The PLD of claim 11, wherein the columns of RAM cells comprise linear groupings of the RAM cells oriented along bit lines of the first array.

14. The PLD of claim 11, wherein the columns of RAM cells comprise linear groupings of the RAM cells oriented along word lines of the first array.

15. A programmable logic device (PLD), comprising:
a first random access memory (RAM) circuit that includes a first array of rows and columns of RAM cells and a first redundant column of the RAM cells;
means for initiating a configuration sequence for the PLD;
means for initiating a built in self test (BIST) procedure on the first array;
means for setting, when an error associated with the first array is reported by the BIST procedure, a first error flag in a first volatile memory circuit associated with a first defective column of the RAM cells in the first array;
wherein a respective error flag is associated with each column of RAM cells in the first array;
first means for loading first PLD configuration data into the first RAM circuit, wherein when the first error flag is set the first PLD configuration data bypasses the first defective column of the RAM cells and a first portion of the first PLD configuration data is loaded into the first redundant column of the RAM cells; and
wherein the first means for loading comprises means for generating for each column of RAM cells a respective selection signal as a function of the error flag associated with each column and a selection signal carried in from an adjacent column of RAM cells, and means for selecting for input to each column of RAM cells in response to the respective selection signal, one of a first set of bits of configuration data addressed to the column of RAM cells and a second set of bits of configuration data addressed to the adjacent column.

16. The PLD of claim 15, further comprising:
a second RAM circuit that includes a second array of rows and columns of the RAM cells and a second redundant column of the RAM cells;
means for initiating the BIST procedure on the second array concurrently with initiating the BIST procedure on the first array;
means for setting, when an error associated with the second array is reported by the BIST procedure, a second error flag in a second volatile memory circuit associated with a second defective column of the RAM cells in the second array; and
wherein a respective error flag is associated with each column of RAM cells in the second array;
second means for loading second PLD configuration data for the PLD into the second RAM circuit, wherein when the second error flag is set the second PLD configuration data bypasses the second defective column of the RAM cells and a second portion of the second PLD configuration data is loaded into the second redundant column of the RAM cells; and
wherein the second means for loading comprises means generating for each column of RAM cells in the second array a respective selection signal as a function of the error flag associated with the column and a selection signal carried in from an adjacent column of RAM cells in the second array, and means for selecting for input to the column of RAM cells, one of a first set of bits of configuration data addressed to the column of RAM cells in the second array and a second set of bits of configuration data addressed to the adjacent column in the second array.

17. The PLD of claim 15, wherein the means for initiating a configuration sequence for the PLD comprises means for detecting a powering up of the PLD.

18. The PLD of claim 15, wherein the PLD is a field programmable gate array (FPGA).

19. The PLD of claim 15, wherein the first RAM circuit includes a plurality of redundant columns of the RAM cells, and the means for setting the first error flag comprises means for setting the respective error flag associated with each defective column of RAM cells.

20. The PLD of claim 19, wherein the plurality of redundant columns of the RAM cells are adjacent to one another within the first RAM circuit.

21. The PLD of claim 19, wherein the plurality of redundant columns of the RAM cells are organized into groups that are equally spaced from one another within the first RAM circuit.

22. The PLD of claim 15, wherein the BIST procedure comprises writing and reading a checkerboard pattern and a reverse checkerboard pattern.

23. The PLD of claim 15, wherein the columns of RAM cells comprise linear groupings of the RAM cells oriented along bit lines of the array.

24. The PLD of claim 15, wherein the columns of RAM cells comprise linear groupings of the RAM cells oriented along word lines of the array.

25. A method of operating a programmable logic device (PLD) comprising a first random access memory (RAM) circuit that includes a first array of rows and columns of RAM cells and a first redundant column of the RAM cells, the method comprising:

initiating operation of the PLD that has the first array configured for operation of the PLD;
initiating a built in self test (BIST) procedure on the configured first array;
resuming operation of the PLD when no errors associated with the first array are reported by the BIST procedure;
setting, when an error associated with the first array is reported by the BIST procedure, a first error flag in a first volatile memory circuit associated with a first defective column of the RAM cells in the first array;
wherein a respective error flag is associated with each column of RAM cells in the first array;
generating for each column of RAM cells a respective selection signal as a function of the error flag associated with each column and a selection signal carried in from an adjacent column of RAM cells; and
resuming operation of the PLD, when an error associated with the first array is reported by the BIST procedure, while using the first error flag to bypass the first defective column and to shunt read and write data from and to a first adjacent column instead of the first defective column in response to the selection signal carried in from the first adjacent column.

26. The method of claim 25, wherein the PLD comprises a second RAM circuit that includes a second array of rows and columns of the RAM cells and a second redundant column of the RAM cells, the method further comprising:
wherein the second array is configured for operation of the PLD;
initiating the BIST procedure on the configured second array concurrently with initiating the BIST procedure on the first array; and
setting, when an error associated with the second array is reported by the BIST procedure, a second error flag in a second volatile memory circuit associated with a second defective column of the RAM cells in the second array,
wherein a respective error flag is associated with each column of RAM cells in the second array; and
wherein resuming operation of the PLD, when an error associated with the second array is reported by the BIST procedure, comprises using the second error flag to bypass the second defective column and to shunt read and write data from and to the second redundant column instead of the second defective column.

27. The method of claim 25, wherein the PLD is a field programmable gate array (FPGA).

28. The method of claim 25, wherein the first RAM circuit includes a plurality of redundant columns of the RAM cells, and setting the first error flag comprises setting the respective error flag associated with each defective column of RAM cells.

29. The method of claim 28, wherein the plurality of redundant columns of the RAM cells are adjacent to one another within the first RAM circuit.

30. The method of claim 28, wherein the plurality of redundant columns of the RAM cells are organized into groups that are equally spaced from one another within the first RAM circuit.

31. The method of claim 25, wherein the BIST procedure comprises writing and reading a checkerboard pattern and a reverse checkerboard pattern.

32. The method of claim 25, wherein the columns of RAM cells comprise linear groupings of the RAM cells oriented along bit lines of the array.

33. The method of claim 25, wherein the columns of RAM cells comprise linear groupings of the RAM cells oriented along word lines of the array.

34. A programmable logic device (PLD), comprising:
a first random access memory (RAM) circuit that includes a first array of rows and columns of RAM cells and a first redundant column of the RAM cells;
means for initiating operation of the PLD that has the first array configured for operation of the PLD;
means for initiating a built in self test (BIST) procedure on the configured first array;
means for resuming operation of the PLD when no errors associated with the first array are reported by the BIST procedure;
means for setting, when an error associated with the first array is reported by the BIST procedure, a first error flag in a first volatile memory circuit associated with a first defective column of the RAM cells in the first array;
wherein a respective error flag is associated with each column of RAM cells in the first array;
means for generating for each column of RAM cells a respective selection signal as a function of the error flag associated with each column and a selection signal carried in from an adjacent column of RAM cells; and
means for resuming operation of the PLD, when an error associated with the first array is reported by the BIST procedure, while using the first error flag to bypass the first defective column and to shunt read and write data from and to a first adjacent column instead of the first defective column in response to the selection signal carried in from the first adjacent column.

35. The PLD of claim 34, further comprising:
a second RAM circuit that includes a second array of rows and columns of the RAM cells and a second redundant column of the RAM cells;
wherein the second array is configured for operation of the PLD;
means for initiating the BIST procedure on the configured second array concurrently with initiating the BIST procedure on the first array; and
means for setting, when an error associated with the second array is reported by the BIST procedure, a second error flag in a second volatile memory circuit associated with a second defective column of the RAM cells in the second array,
wherein a respective error flag is associated with each column of RAM cells in the second array; and
wherein the means for resuming operation comprises means for, when an error associated with the second array is reported by the BIST procedure, using the second error flag to bypass the second defective column and to shunt read and write data from and to the second redundant column instead of the second defective column.

36. The PLD of claim 34, wherein the PLD is a field programmable gate array (FPGA).

37. The PLD of claim 34, wherein the first RAM circuit includes a plurality of redundant columns of the RAM cells, and the means for setting the first error flag comprises means for setting the respective error flag associated with each defective column of RAM cells.

38. The PLD of claim 37, wherein the plurality of redundant columns of the RAM cells are adjacent to one another within the first RAM circuit.

39. The PLD of claim 37, wherein the plurality of redundant columns of the RAM cells are organized into groups that are equally spaced from one another within the first RAM circuit.

40. The PLD of claim 34, wherein the BIST procedure comprises writing and reading a checkerboard pattern and a reverse checkerboard pattern.

41. The PLD of claim 34, wherein the columns of RAM cells comprise linear groupings of the RAM cells oriented along bit lines of the array.

42. The PLD of claim 34, wherein the columns of RAM cells comprise linear groupings of the RAM cells oriented along word lines of the array.

* * * * *